US009305750B2

(12) United States Patent
Long et al.

(10) Patent No.: US 9,305,750 B2
(45) Date of Patent: Apr. 5, 2016

(54) ADJUSTING CURRENT RATIOS IN INDUCTIVELY COUPLED PLASMA PROCESSING SYSTEMS

(75) Inventors: Maolin Long, Cupertino, CA (US); Seyed Jafar Jafarian-Tehrani, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 1047 days.

(21) Appl. No.: 12/728,112

(22) Filed: Mar. 19, 2010

(65) Prior Publication Data

US 2010/0314048 A1 Dec. 16, 2010

Related U.S. Application Data

(60) Provisional application No. 61/186,710, filed on Jun. 12, 2009.

(51) Int. Cl.
*C23C 16/00* (2006.01)
*H01L 21/306* (2006.01)
(Continued)

(52) U.S. Cl.
CPC ......... *H01J 37/32174* (2013.01); *H01J 37/321* (2013.01); *H01J 37/3211* (2013.01); *H01J 37/32137* (2013.01); *H01J 37/32183* (2013.01);
(Continued)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ....... 118/723 I, 723 IR, 723 AN; 156/345.48, 156/345.49; 315/111.51
See application file for complete search history.

(56) References Cited

U.S. PATENT DOCUMENTS 5,792,261 A * 8/1998 Hama et al. ................. 118/723 I
5,907,221 A    5/1999 Sato et al. ................. 315/111.51
(Continued)

FOREIGN PATENT DOCUMENTS

CN    101440484    5/2009 ............. C23C 16/44
JP    2003-100723 A    4/2003
(Continued)

OTHER PUBLICATIONS

"International Search Report", Issued in PCT Application No. PCT/US2010-037942; Mailing Date: Dec. 27, 2010.
(Continued)

*Primary Examiner* — Luz Alejandro Mulero
(74) *Attorney, Agent, or Firm* — Martine Penilla Group, LLP

(57) ABSTRACT

A plasma processing system for generating plasma to process at least a wafer. The plasma processing system may include a first coil for conducting a first current for sustaining at least a first portion of the plasma. The plasma processing system may also include a second coil for conducting a second current for sustaining at least a second portion of the plasma. The plasma processing system may also include a power source for powering the first current and the second current. The plasma processing system may also include a parallel circuit for adjusting one of the amperage of the first current and the amperage of the second current. The parallel circuit may be electrically coupled between the power source and at least one of the first coil and the second coil. The parallel circuit may include an inductor and a variable capacitor electrically connected in parallel to each other.

14 Claims, 4 Drawing Sheets

(51) Int. Cl.
*H01J 37/32* (2006.01)
*H05H 1/46* (2006.01)

(52) U.S. Cl.
CPC .......... *H05H 1/46* (2013.01); *H05H 2001/4652* (2013.01); *H05H 2001/4667* (2013.01)

(56) References Cited

U.S. PATENT DOCUMENTS

| | | | |
|---|---|---|---|
| 6,016,131 A * | 1/2000 | Sato et al. | 343/895 |
| 6,326,597 B1 * | 12/2001 | Lubomirsky et al. | 219/494 |
| 6,524,432 B1 | 2/2003 | Collins et al. | |
| 6,876,155 B2 * | 4/2005 | Howald et al. | 315/111.51 |
| 2002/0041160 A1 | 4/2002 | Barnes et al. | |

FOREIGN PATENT DOCUMENTS

| | | | |
|---|---|---|---|
| JP | 2008-078355 A | 4/2008 | ............ H01L 21/205 |
| KR | 10-2001-0031915 A | 3/2007 | |
| KR | 10-2008-0047141 A | 5/2008 | |

OTHER PUBLICATIONS

"Written Opinion", issued in PCT Application No. PCT/US2010-037942; Mailing Date: Dec. 27, 2010.
"International Preliminary Report on Patentability", PCT Application No. PCT/US2010-037942, Mailing Date: Dec. 22, 2011.

* cited by examiner

ADJUSTING CURRENT RATIOS IN INDUCTIVELY COUPLED PLASMA PROCESSING SYSTEMS

CROSS REFERENCE TO RELATED APPLICATION

The present invention claims priority under 35 U.S.C. 119(e) to a commonly owned provisionally filed patent application entitled "ADJUSTING CURRENT RATIOS IN INDUCTIVELY COUPLED PLASMA PROCESSING SYSTEMS," U.S. Application No. 61/186,710, filed on 12 Jun. 2009, by inventors Maolin Long and Seyed Jafar Jafarian-Tehrani, all of which is incorporated herein by reference.

BACKGROUND OF THE INVENTION

The present invention relates to plasma processing systems. In particular, the present invention relates to plasma processing systems having capability of coil current ratio adjustment for controlling plasma uniformity.

Plasma processing systems are employed in various industries for fabricating devices on wafers. For example, the industries may include semiconductor, magnetic read/write and storage, optical system, and micro-electromechanical system (MEMS) industries. A plasma processing system may generate and sustain plasma in a plasma processing chamber to perform etching and/or deposition on a wafer such that device features may be formed on the wafer. In fabricating devices, it may be important to control plasma uniformity in order to satisfy certain production yield requirements and/or certain feature specifications. In general, plasma uniformity control may involve utilizing a power splitter having current adjustment capability, as discussed with reference to the example of FIG. 1.

FIG. 1 shows a schematic representation illustrating a cross-sectional view of an example prior art plasma processing system 100. Plasma processing system 100 may include a plasma processing chamber, which may include structural components such as a chamber wall 132, a pinnacle 130, a dielectric window 128, etc., for containing plasma, as illustrated by plasma 180. Inside the plasma processing chamber, plasma processing system 100 may include a chuck 136 (such as an electrostatic chuck) for supporting a wafer, as illustrated by wafer 134, during plasma processing.

Plasma processing system 100 may also include a radio frequency (RF) power source 170, an inner coil 126 disposed on dielectric window 128 and electrically coupled with RF power source 170, and an outer coil 124 electrically coupled with RF power source 170 and surrounding inner coil 126. Inner coil 126 and outer coil 124 may be disposed inside coil enclosure 138, which may be coupled to chamber wall 132. RF power source 170 may produce RF currents conducted by inner coil 126 and outer coil 124 for generating and sustaining plasma 180. For example, inner coil 126 may conduct a first RF current mainly for sustaining an inner portion of plasma 180 (near inner coil 126), and outer coil 124 may conduct a second RF current mainly for sustaining an outer portion of plasma 180 (near inner coil 124).

Plasma processing system 100 may also include a power splitter 112 for adjusting the RF currents conducted by inner coil 126 and outer coil 124, thereby controlling the uniformity of plasma 180. Power splitter 112 may be electrically coupled with RF power source 170 through a matching network 102. Power splitter 112 may include a variable capacitor 116 electrically coupled between RF power source 170 and inner coil 126 for adjusting the amperage of the first RF current, thereby adjusting the density of the inner portion of plasma 180. Power splitter 112 may also include another variable capacitor 120 electrically coupled between RF power source 170 and outer coil 126 for adjusting the amperage of the second RF current, thereby adjusting the density of the outer portion of plasma 180. By enabling separate adjustment of different portions of plasma 180, power splitter 112 may facilitate controlling the uniformity of plasma 180.

However, power splitter 112 may involve several disadvantages. For example, given that power splitter 112 requires two variable capacitors 116 and 120, costs for manufacturing, maintaining, and operating power splitter 112 may be substantially high. Currently, a variable capacitor (such as a variable vacuum capacitor) may cost more than 1,000 US Dollars; therefore, manufacturing power slitter 112 may cost more than 2,000 US Dollars. Moreover, each of variable capacitors 116 and 120 may include mechanical parts that may incur substantial maintenance and operating costs. In addition, each of variable capacitors 116 and 120 may require a step motor for actuating the mechanical parts to perform capacitance adjustment. The two step motors also may incur significant manufacturing, maintenance, and operating costs for power splitter 112. As a result, power splitter 112 may substantially increase the manufacturing, maintenance, and operating costs of plasma processing system 100.

The two variable capacitors and the two step motors may include a substantially large number of mechanical moving parts. The substantially large number of mechanical moving parts may introduce significant reliability problems in operating plasma processing system 100. Malfunction of any of the mechanical moving parts may negatively affect the plasma processing process and may lead to undesirable production yield.

In addition, given the limitations of existing commercially available capacitors, power splitter 112 may provide only a limited usable current ratio range. Operating plasma processing system 100 outside of the usable range may lead to unstable plasma, arcing, or failure of tuning by matching network 102; as a result, production yield requirements and/or device feature specifications may not be satisfied.

SUMMARY OF INVENTION

An embodiment of the invention is related to a plasma processing system for generating plasma to process at least a wafer. The plasma processing system may include a first coil for conducting a first current for sustaining at least a first portion of the plasma. The plasma processing system may also include a second coil for conducting a second current for sustaining at least a second portion of the plasma. The plasma processing system may also include a power source for powering the first current and the second current. The plasma processing system may also include a parallel circuit for adjusting one of the amperage of the first current and the amperage of the second current. The parallel circuit may be electrically coupled between the power source and at least one of the first coil and the second coil. The parallel circuit may include an inductor and a variable capacitor electrically connected in parallel to each other.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
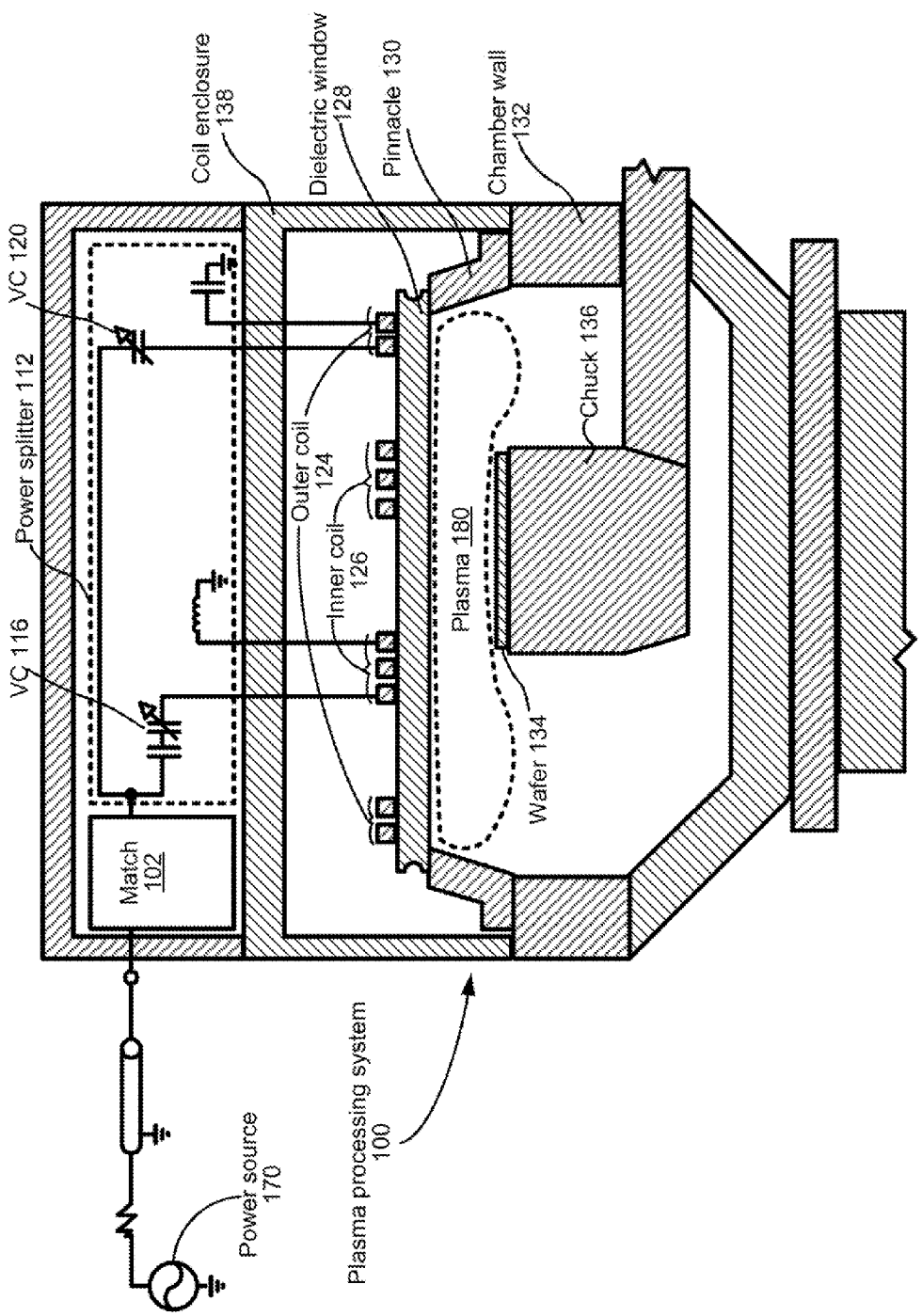
FIG. 1 shows a schematic representation illustrating a cross-sectional view of an example prior art plasma processing system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a plasma processing system for generating plasma to process at least a substrate. The plasma processing system may include a first coil for conducting a first current (e.g., an RF current) for sustaining at least a first portion of the plasma. The plasma processing system may also include a second coil for conducting a second current (e.g., an RF current) for sustaining at least a second portion of the plasma. The plasma processing system may also include a power source (e.g., an RF power source) electrically coupled with the first coil and the second coil for powering the first current and the second current. The plasma processing system may also include a power splitter for adjusting the amperage of the first current, to adjust the ratio of the first current to the second current for controlling the uniformity of the plasma.

In one or more embodiments, the first coil and second coil may be disposed in a substantially coaxial arrangement, for achieving substantially symmetrical distribution of plasma. In one or more embodiments, the first coil and second coil may be disposed in a substantially eccentric arrangement, for meeting specific plasma distribution requirements.

In one or more embodiments, the first coil may represent an inner coil, and the second coil may represent an outer coil having a diameter larger than the diameter of the first coil. In one or more embodiments, at least a portion of the second coil may surround at least a portion of the first coil.

In one or more embodiments, the first coil may represent an outer coil, and the second coil may represent an inner coil having a diameter smaller than the diameter of the first coil. In one or more embodiments, at least a portion of the second coil may be surrounded by at least a portion of the first coil.

In one or more embodiments, the first coil and the second coil may be disposed on the same plane, such that supporting hardware design may be simplified and that the tolerance of the coil-to-window gap tolerance may be consistently controlled. In additional, the coplanar coil arrangement could be the optimal configuration for some plasma processing system designs. In one or more embodiments, the first coil may be disposed on a first plane, and the second coil may be disposed on a second plane that is different from the first plane, for optimum coil arrangements given particular plasma processing system designs.

The power splitter may include a parallel inductor-capacitor circuit (i.e., a parallel LC circuit, or a tank circuit) for changing the impedance between the power source and the first coil to adjust the amperage of the first current. The parallel LC circuit may be electrically coupled between a matching network and the first coil, and/or electrically coupled between the power source and the first coil. The parallel LC circuit may include an inductor and a variable capacitor (such as a variable vacuum capacitor or a variable air-gap capacitor), wherein the inductor and the variable capacitor may be electrically connected in parallel to each other.

In contrast with the aforementioned example prior art arrangements that require two variable capacitors, embodiments of the invention may require only one variable capacitor for controlling plasma uniformity in plasma processing systems that include two plasma-sustaining coils. Advantageously, embodiments of the invention may be associated with substantially lower costs and substantially higher reliability.

In addition, with resonance effects (or harmonic oscillation effects), the parallel LC circuit may provide a substantially larger value range for the impedance between the matching network and the first coil than the range provided by the variable capacitor (such as variable capacitor 116 illustrated in the example of FIG. 1) utilized in prior art arrangements. As a result, embodiments of the invention may advantageously enable a substantially larger current ratio range for satisfying more production yield requirements and/or more device feature requirements. For example, embodiments of the invention may enable adjusting the current ratio between a negative value and a positive value (e.g., in the range of about −0.5 to about 2.0) in a continuous manner. In contrast, prior art arrangements may not be able to provide continuous adjustment from a positive current ratio to a negative current ratio without causing interruptions, difficulties, or even failure in operation.

It may be generally believed that the resonance effects of (high-Q) parallel LC circuits may cause controllability problems or sensitivity problems around the resonant point; therefore, the use of parallel LC circuits may be typically avoided in designing and manufacturing plasma processing systems. However, since the impedance typically appears in the denominator when calculating and/or adjusting the current, extremely high impedance at the resonant point may actually correspond to a very small value of the current; as a result, the operation may be continuously smooth from the normal mode (with a positive current ratio) to the reversed current mode (with a negative current ratio) with well-behaved sensitivity, without incurring the generally believed controllability problems or sensitivity problems. In a non-obvious manner, embodiments of the invention may take advantage of the resonance effects of parallel LC circuit to provide a wider current ratio range to further enhance the controllability of plasma processing systems.

In one or more embodiments, the power splitter may further include an additional inductor electrically coupled between the power source and the second coil. The additional inductor may introduce impedance to reduce the amperage of the second current. Advantageously, the current ratio range may be further expanded to satisfy even more production yield requirements and/or even more device feature requirements.

The features and advantages of the present invention may be better understood with reference to the figures and discussions that follow.

Figure 2:
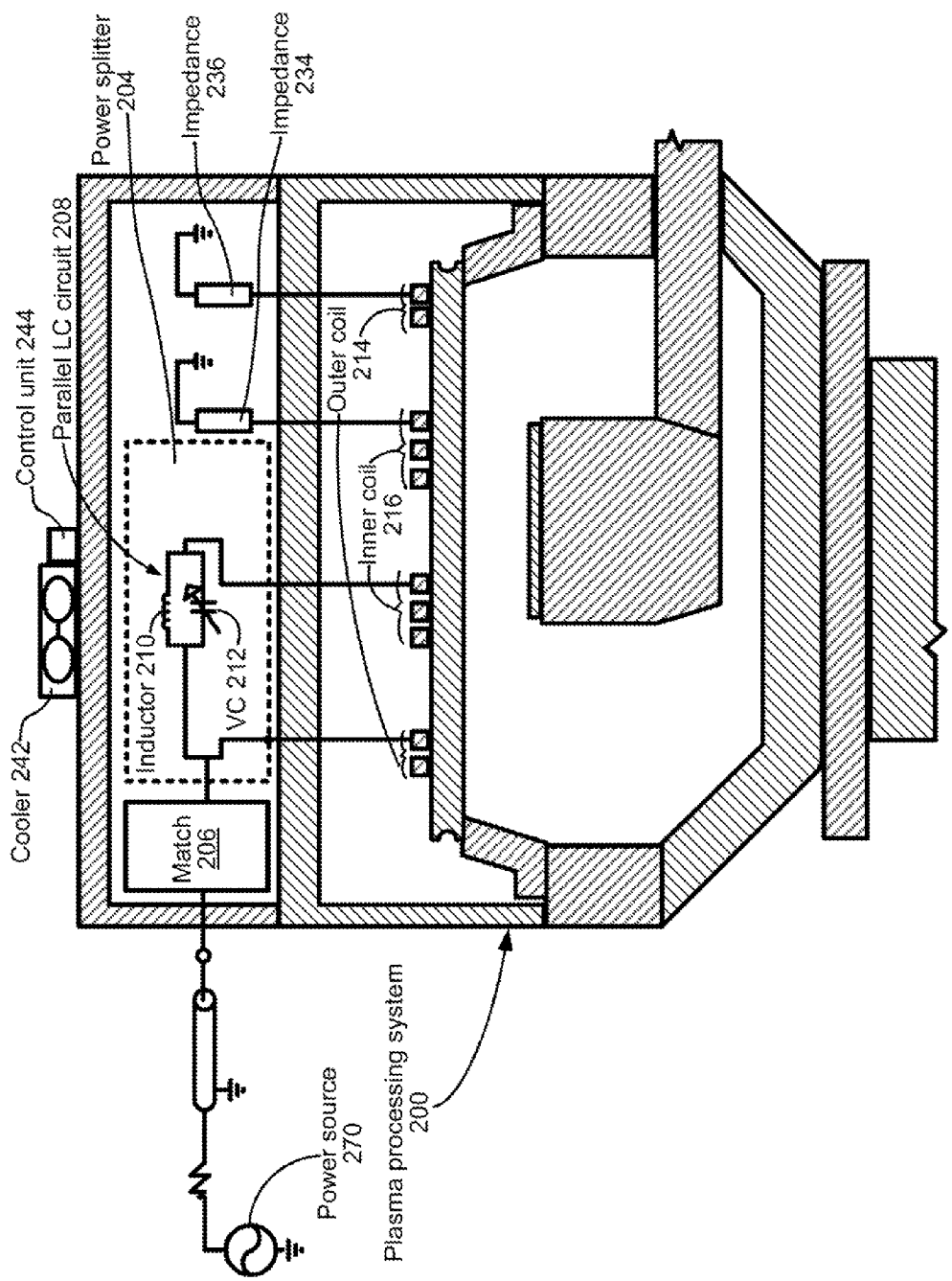
FIG. 2 shows a schematic representation illustrating a cross-sectional view of a plasma processing system including a power splitter in accordance with one or more embodiments of the present invention.

FIG. 2 shows a schematic representation illustrating a cross-sectional view of a plasma processing system 200 including a power splitter 204 in accordance with one or more embodiments of the present invention. Plasma processing system 200 may include one or more components, such as a plasma processing chamber, a chuck, a power source, coils, a coil enclosure, and/or a matching network, that may be similar to or different from one or more components of plasma processing system 100 discussed in the example of FIG. 1. In particular, plasma processing system 200 may include a power splitter 204 that is novel and inventive in view of power splitter 112 of plasma processing system 100 illustrated in the example of FIG. 1, for facilitating plasma uniformity control through adjusting the ratio between currents conducted by the coils.

Power splitter 204 may be electrically coupled with an RF power source 270 through a matching network 206. Power splitter 204 may include a parallel inductor-capacitor circuit 208 (or parallel circuit 208) electrically coupled between RF power source 270 and a coil 216 for adjusting the amperage of the current (e.g., an RF current) conducted by coil 216. The termination of coil 216 may represented by impedance 236. Parallel circuit 208 may include an inductor 210 and a variable capacitor 212 electrically connected in parallel to each other. Parallel circuit 208 may form a tank circuit such that the resonance effects of the tank circuit may introduce a wide range of possible impedance values between matching network 206 and coil 216 (and/or between RF power source 270 and coil 216). Accordingly, power splitter 204 may enable a wide range for the ratio between the amperage of the current conducted by coil 216 and the amperage of the current conducted by another coil, illustrated by a coil 214. The termination of coil 214 may be represented by impedance 234. In one or more embodiments, coil 214 may surround coil 216. Advantageously, plasma processing system 200 may be able to satisfy more production yield requirements and/or more device feature requirements than plasma processing system 100.

Power splitter 204 may require only one variable capacitor (i.e., variable capacitor 212) and only one associated step motor, in comparison with two variable capacitors and two associated step motors required by power splitter 112 of plasma processing system 100. Advantageously, the manufacturing, maintenance, and/or operating costs associated with power splitter 204 may be substantially lower than the costs associated with power splitter 112. In addition, with fewer mechanical moving parts, power splitter 204 may also have substantially higher reliability than power splitter 112.

In one or more embodiments, instead of being electrically coupled between matching network 206 and coil 216, parallel circuit 208 may be electrically coupled between matching network 206 and coil 214 for adjusting the amperage of the current (e.g., an RF current) conducted by coil 214 to, for example, satisfy different plasma uniformity control requirements.

For adjusting the ratio between the current conducted by coil 216 and the current conducted by coil 214, power splitter 204 (or plasma processing system 200) may require only one parallel circuit or only one variable capacitor. Advantageously, in achieving desirable plasma uniformity control, costs may be minimized, and reliability may be maximized.

Plasma processing system 200 may also include a control unit 244 (which may include one or more monitoring devices) for driving variable capacitor 212 in power splitter 204 to regulate the RF current ratio to the desired setpoint.

Plasma processing system 200 may also include a cooler 242 (e.g., a cooling fan) for cooling parallel circuit 208, to ensure the optimal performance of power splitter 204. In one more embodiments, inductor 210 may be plated with a highly conductive material, such as silver, for facilitating heat dissipation to ensure the optimal performance of power splitter 204 with low power loss.

Figure 3:
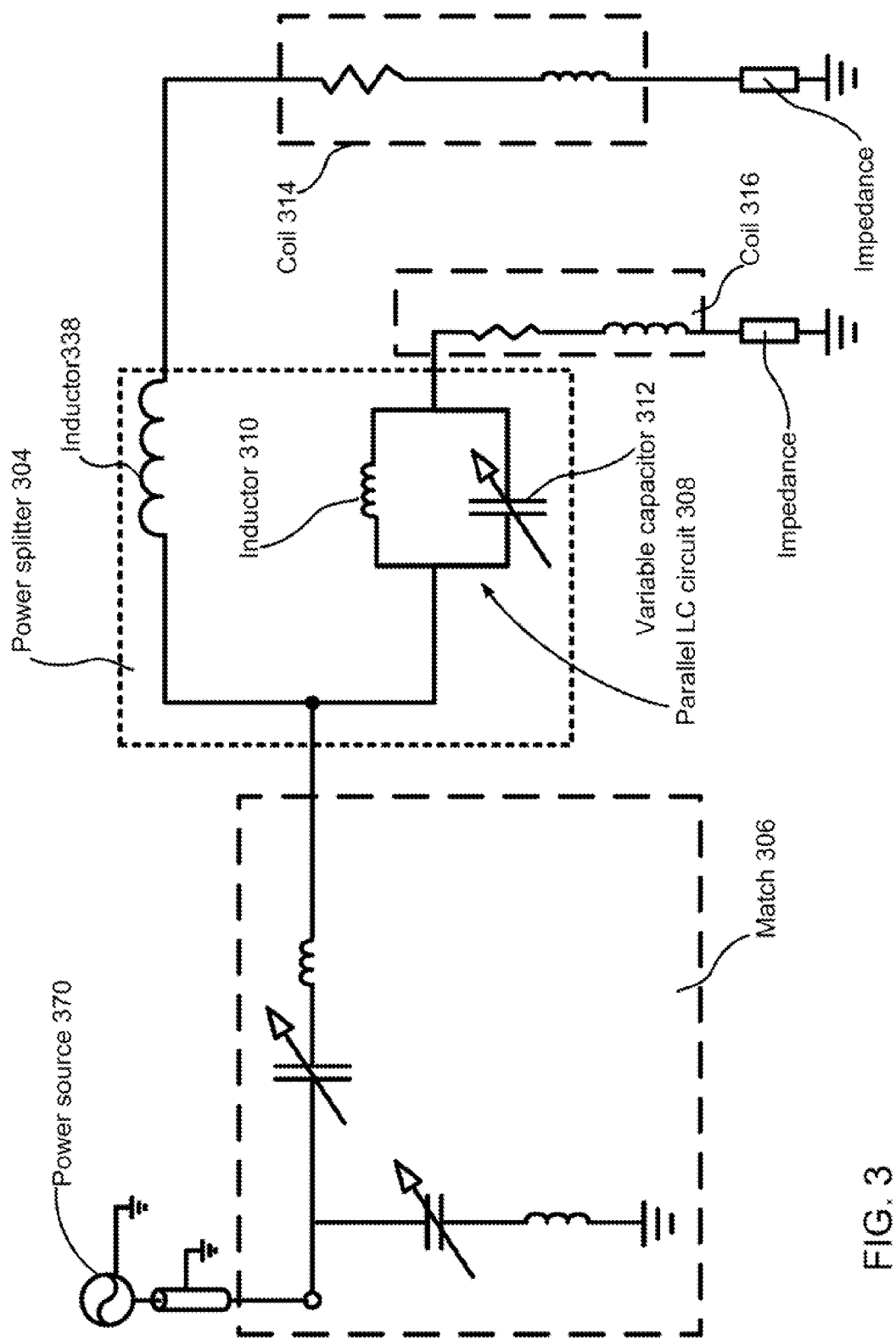
FIG. 3 shows a schematic representation illustrating an electrical model of a power splitter in accordance with one or more embodiments of the present invention.

FIG. 3 shows a schematic representation illustrating an electrical model of a power splitter 304 in accordance with one or more embodiments of the present invention. Power splitter 304 may be implemented in a plasma processing system similar to plasma processing system 200 illustrated in the example of FIG. 2 and may be electrically coupled with an RF power source 370 through a matching network 306.

Power splitter 304 may include a parallel inductor-capacitor circuit 308 (or parallel circuit 308) electrically coupled between RF power source 370 and a coil 316 (modeled with resistance and inductance) for adjusting the amperage of the current (e.g., an RF current) conducted by coil 316. The current conducted by coil 316 may sustain at least a portion of the plasma generated in the plasma processing system. Parallel circuit 308 may include an inductor 310 and a variable capacitor 312 electrically connected in parallel to each other. Parallel circuit 308 may form a tank circuit with resonance effects to enlarge the range of possible impedance values between RF power source 370 and coil 316.

Power splitter 304 may also include an additional inductor 338 electrically coupled between RF power source 370 and a coil 314, with inductor 338 and parallel circuit 308 being electrically connected in parallel to each other. Inductor 338 may introduce impedance to reduce the amperage of the current conducted by coil 314 (wherein the current conducted by coil 314 may sustain at least a different portion of the plasma). As a result, the range of the ratio of the current conducted by coil 316 to the current conducted by coil 314 may be further expanded to further improve the plasma uniformity control capability of the plasma processing system. Advantageously, even more production yield requirements and/or even more device feature requirements may be satisfied.

Various connection arrangements for power splitter 304 and the coils may be implemented to satisfy various plasma processing requirements. In one or more embodiments, coil 316 may represent an inner coil surrounded by coil 314, which may represent an outer coil. In one or more embodiments, coil 316 may represent an outer coil surrounding coil 314, which may represent an inner coil.

Figure 4:
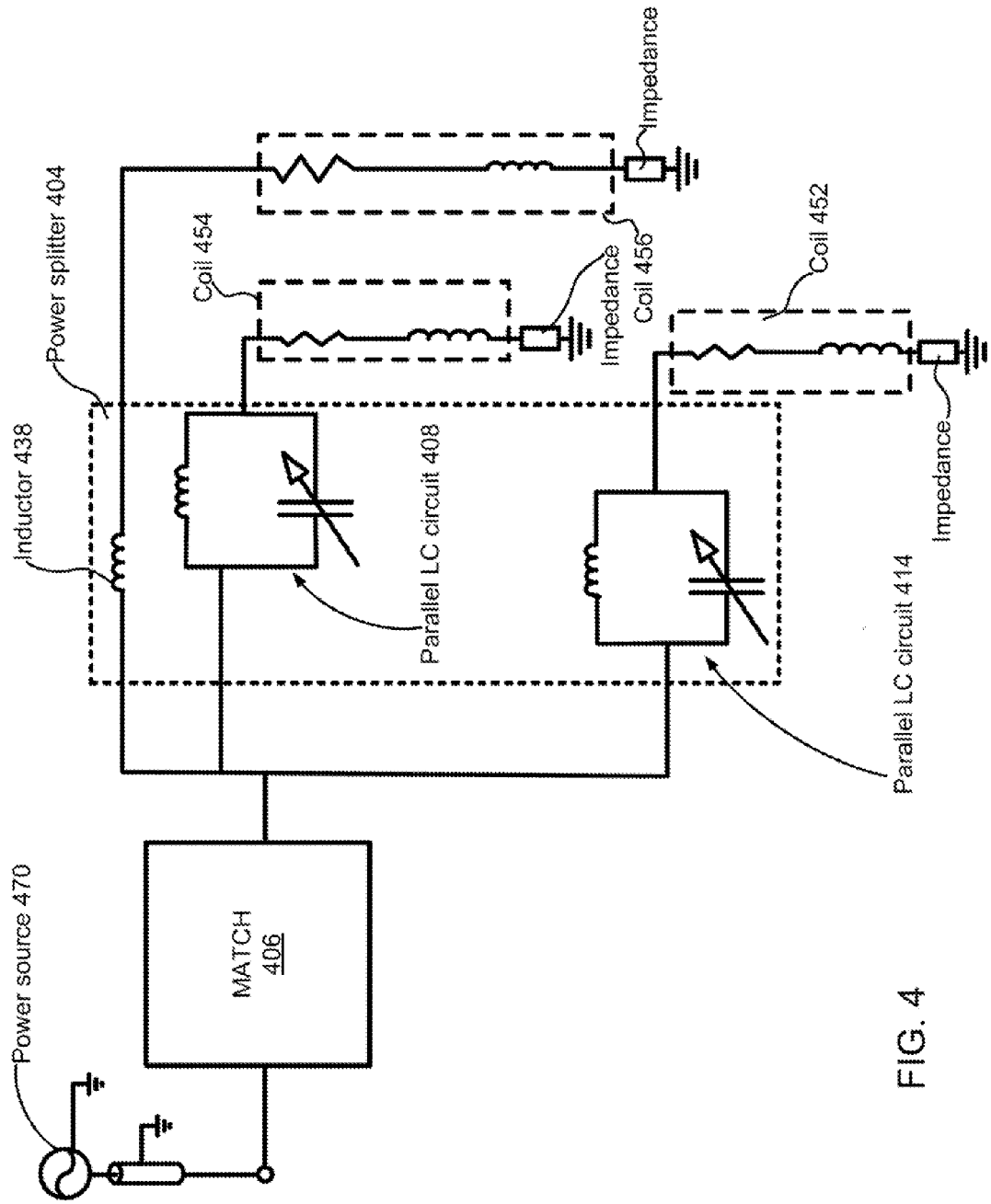
FIG. 4 shows a schematic representation illustrating an electrical model of a power splitter in accordance with one or more embodiments of the present invention.

FIG. 4 shows a schematic representation illustrating an electrical model of a power splitter 404 in accordance with one or more embodiments of the present invention. Power splitter 404 may be implemented in a plasma processing system similar to plasma processing system 200 illustrated in the example of FIG. 2 but having more coils for finer plasma uniformity control. For example, the coils may include coil 452, coil 454, and coil 456, wherein each of the coils is modeled as resistance and inductance. Power splitter 404 may be electrically coupled with an RF power source 470 through a matching network 406.

Power splitter 404 may include a parallel inductor-capacitor circuit 408 (or parallel circuit 408) electrically coupled between RF power source 470 and coil 454 for adjusting the amperage of the current (e.g., an RF current) conducted by coil 454, wherein the current conducted by coil 454 may sustain at least a first portion of plasma in the plasma processing system. Power splitter 404 may also include a parallel inductor-capacitor circuit 414 (or parallel circuit 414) electrically coupled between RF power source 470 and coil 452 for adjusting the amperage of the current (e.g., an RF current) conducted by coil 452, wherein the current conducted by coil 452 may sustain at least a second portion of the plasma. Each of parallel circuit 408 and parallel circuit 414 may have features and advantages similar to those of one or more of parallel circuit 208 and parallel circuit 308 discussed above with reference to the examples of FIG. 2 and FIG. 3, respectively.

Power splitter 404 may also include an additional inductor 438 electrically coupled between RF power source 470 and coil 456, with inductor 438 and at least parallel circuit 414 being electrically connected in parallel to each other. Inductor 438 may introduce impedance to reduce the amperage of the current conducted by coil 456, wherein the current conducted by coil 456 may sustain at least a third portion of the plasma. As a result, the difference between the current conducted by coil 454 and the current conducted by coil 456 may be further enlarged, and the difference between the current conducted by coil 452 and the current conducted by coil 456 also may be further enlarged. Advantageously, the plasma uniformity control capability of the plasma processing system may be further enhanced to satisfy even more production yield requirements and/or even more device feature requirements.

Various connection arrangements for power splitter 404 and the coils may be implemented to satisfy various plasma processing requirements. The coils may be disposed on the same plane or on different planes, according to various embodiments. In one or more embodiments, the coils may be disposed in a substantially coaxial arrangement. In one or more embodiments, coil 452 may surround coil 454, which may surround coil 456. In one or more embodiments, coil 456 may surround coil 454, which may surround coil 452. In one or more embodiments, coil 452 may surround coil 456, which may surround coil 454.

In one or more embodiments, the plasma processing system may include more than three coils (i.e., including one or more coils in addition to coils 452, 454, and 456) for sustaining various portion of the plasma to facilitate even finer control of plasma uniformity. For example, the plasma processing system may include N coils, wherein N represents an integer that is greater than 3. Power splitter 404 may include N−1 (i.e., N minus 1) parallel inductor-capacitor circuits for adjusting the amperages of currents conducted by N−1 of the N coils, e.g., except coil 456. Each of the parallel inductor-capacitor circuits may be electrically coupled between RF power source 470 and one of the N−1 coils. The parallel inductor-capacitor circuits may have features and advantages similar to those of one or more of parallel circuit 208 and parallel circuit 308 discussed above with reference to the examples of FIG. 2 and FIG. 3, respectively.

As can be appreciated from the foregoing, embodiments of the present invention may reduce the required quantity of costly variable capacitors in implementing plasma uniformity control capability for plasma processing systems. Advantageously, manufacturing, maintenance, and operating costs of plasma processing systems may be reduced.

Embodiments of the invention may also effectively reduce the number of mechanical parts in plasma processing systems. Advantageously, reliability of plasma processing systems may be improved.

Embodiments of the invention may also take advantage of the resonance effects of parallel LC circuits to enlarge current ratio range in controlling plasma uniformity. Advantageously, more production yield requirements and/or more device feature requirements may be satisfied.

Embodiments of the invention may also facilitate implementation of more coils for individually sustaining different portion of plasma. Advantageously, finer granularity of plasma uniformity control may be enabled for satisfying more sophisticated plasma processing requirements.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A plasma processing system for generating plasma, the plasma processing system comprising:
    a first coil configured to conduct a first current for sustaining at least a first portion of the plasma;
    a second coil configured to conduct a second current for sustaining at least a second portion of the plasma;
    a power source configured to power the first current and the second current, the power source being electrically coupled with the first coil and the second coil; and
    a first parallel circuit configured to adjust an amperage of the first current, the first parallel circuit being electrically coupled between the power source and the first coil, the first parallel circuit including at least a first inductor and a first variable capacitor, the first inductor and the first variable capacitor being electrically connected in parallel to each other, so that a first node joins first terminal ends of the first variable capacitor and the first inductor and a second node joins second terminal ends of the first variable capacitor and the first inductor, the first node being directly connected to the first coil and the second node being connected to the power source and the second coil, wherein the first variable capacitor is configured to adjust the amperage of the first current.

2. The plasma processing system of claim 1, further comprising a cooler configured to cool the first parallel circuit.

3. The plasma processing system of claim 1, further comprising:
    a third coil configured to conduct a third current for sustaining at least a third portion of the plasma, the power source being further configured for powering the third current; and
    a second parallel circuit configured to adjust the amperage of the third current, the second parallel circuit being electrically coupled between the power source and the third coil, the second parallel circuit including at least a second inductor and a second variable capacitor, the second inductor and the second variable capacitor being electrically connected in parallel to each other.

4. The plasma processing system of claim 3, wherein the third coil surrounds the second coil, and the second coil surrounds the first coil.

5. The plasma processing system of claim 3 further comprising a third inductor coupled between the power source and the second coil and configured to reduce an amperage of the second current.

6. The plasma processing system of claim 5, wherein
the third coil surrounds the second coil, and
the second coil surrounds the first coil.

7. The plasma processing system of claim 5, wherein
the third coil surrounds the first coil, and
the first coil surrounds the second coil.

8. The plasma processing system of claim 5, wherein
the second coil surrounds the first coil, and
the first coil surrounds the third coil.

9. The plasma processing system of claim 1, further comprising a second inductor configured to reduce an amperage of the second current, the second inductor being electrically coupled between the power source and the second coil, wherein the first parallel circuit is not electrically coupled between the power source and the second coil.

10. A plasma processing system for generating plasma, the plasma processing system comprising:
a first coil configured to conduct a first current for sustaining at least a first portion of the plasma;
a second coil configured to conduct a second current for sustaining at least a second portion of the plasma;
a power source configured to power the first current and the second current, the power source being electrically coupled with the first coil and the second coil; and
a first parallel circuit configured to adjust an amperage of the first current, the first parallel circuit being electrically coupled between the power source and the first coil, the first parallel circuit including at least a first inductor and a first variable capacitor, the first inductor and the first variable capacitor being electrically connected in parallel to each other, so that a first node joins first terminal ends of the first variable capacitor and the first inductor and a second node joins second terminal ends of the first variable capacitor and the first inductor, the first node being directly connected to the first coil and the second node being connected to the power source, wherein the first variable capacitor is configured to adjust the amperage of the first current,
wherein the first parallel circuit is configured to adjust the amperage of the first current and not the amperage of the second current, and the second coil surrounds the first coil,
a second inductor electrically coupled between the second node and the second coil, wherein the second inductor is configured to reduce the amperage of the second current, wherein the second inductor is coupled to the second node.

11. A power splitter for adjusting a ratio of an amperage of a first current to an amperage of a second current in a plasma processing system, the plasma processing system including a first coil for conducting the first current for sustaining at least a first portion of a plasma, the plasma processing system further including a second coil for conducting the second current for sustaining at least a second portion of the plasma, the plasma processing system further including a power source for powering the first current and the second current, the power splitter comprising:
a parallel inductor-capacitor circuit being coupled between the power source and the first coil, the parallel inductor-capacitor circuit including:
a first inductor electrically coupled between the power source and the first coil; and
a first variable capacitor electrically coupled between the power source and the first coil, the first inductor and the first variable capacitor being electrically connected in parallel, wherein a first node joins first terminal ends of the first variable capacitor and the first inductor and a second node joins second terminal ends of the first variable capacitor and the first inductor, the first node being directly connected to the first coil and the second node being connected to a matching network and to the second coil, wherein the first variable capacitor is configured to adjust an amperage of the first current.

12. The power splitter of claim 11, further comprising a second inductor electrically coupled between the matching network and the second coil, wherein the second inductor is configured to reduce the amperage of the second current, the second inductor being electrically coupled between the power source and the second coil.

13. The power splitter of claim 11, further comprising a second parallel inductor-capacitor circuit, the second parallel inductor-capacitor circuit being electrically coupled between the power source and a third coil of the plasma processing system, wherein the third coil is configured to adjust an amperage of a third current conducted by the third coil, the second parallel inductor-capacitor circuit including a second inductor and a second variable capacitor, the second inductor and the second variable capacitor being electrically connected in parallel to each other.

14. The power splitter of claim 13, further comprising a third inductor for reducing the amperage of the second current, the third inductor being electrically coupled between the power source and the second coil.

* * * * *